United States Patent
Konno et al.

(10) Patent No.: US 10,418,241 B2
(45) Date of Patent: Sep. 17, 2019

(54) METAL CHLORIDE GAS GENERATOR, HYDRIDE VAPOR PHASE EPITAXY GROWTH APPARATUS, AND NITRIDE SEMICONDUCTOR TEMPLATE

(71) Applicant: SUMITOMO CHEMICAL COMPANY, LIMITED, Tokyo (JP)

(72) Inventors: Taichiroo Konno, Hitachi (JP); Hajime Fujikura, Mito (JP); Michiko Matsuda, Arakawa-ku (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 534 days.

(21) Appl. No.: 14/831,514

(22) Filed: Aug. 20, 2015

(65) Prior Publication Data

US 2015/0357416 A1 Dec. 10, 2015

Related U.S. Application Data

(62) Division of application No. 13/569,983, filed on Aug. 8, 2012, now Pat. No. 9,236,252.

(30) Foreign Application Priority Data

Aug. 17, 2011 (JP) .................................. 2011-178413

(51) Int. Cl.

| C30B 29/38 | (2006.01) |
| H01L 21/02 | (2006.01) |
| C30B 25/08 | (2006.01) |
| H01L 29/20 | (2006.01) |
| H01L 29/207 | (2006.01) |

(Continued)

(52) U.S. Cl.
CPC .......... *H01L 21/0262* (2013.01); *C30B 25/08* (2013.01); *C30B 25/14* (2013.01); *C30B 29/403* (2013.01); *C30B 29/406* (2013.01); *H01L 21/0254* (2013.01); *H01L 21/02576* (2013.01); *H01L 21/02581* (2013.01);
(Continued)

(58) Field of Classification Search
CPC ............................... C30B 23/02; C30B 29/38
See application file for complete search history.

(56) References Cited

U.S. PATENT DOCUMENTS

| 6,420,283 B1 | 7/2002 | Ogawa et al. |
| 6,596,079 B1 | 7/2003 | Vaudo et al. |

(Continued)

FOREIGN PATENT DOCUMENTS

| CN | 1310286 C | 4/2007 |
| CN | 101060102 A | 10/2007 |

(Continued)

OTHER PUBLICATIONS

United States Office Action dated Aug. 13, 2015 in co-pending U.S. Appl. No. 13/794,522

(Continued)

*Primary Examiner* — Robert M Kunemund
(74) *Attorney, Agent, or Firm* — McGinn IP Law Group, PLLC.

(57) ABSTRACT

A nitride semiconductor template includes a substrate, and a chlorine-containing nitride semiconductor layer. The chlorine-containing nitride semiconductor layer contains an iron concentration of not higher than $1 \times 10^{17}$ cm$^{-3}$.

20 Claims, 9 Drawing Sheets

(51) Int. Cl.
*H01L 29/04* (2006.01)
*H01L 29/36* (2006.01)
*C30B 25/14* (2006.01)
*C30B 29/40* (2006.01)

(52) U.S. Cl.
CPC ........ *H01L 29/045* (2013.01); *H01L 29/2003* (2013.01); *H01L 29/207* (2013.01); *H01L 29/36* (2013.01)

(56) References Cited

U.S. PATENT DOCUMENTS

| | | |
|---|---|---|
| 6,812,051 B2 | 11/2004 | Usui et al. |
| 6,946,308 B2 | 9/2005 | Hiramatsu et al. |
| 7,170,095 B2 * | 1/2007 | Vaudo ............... H01L 21/02425 257/76 |
| 7,556,688 B2 | 7/2009 | Melnik et al. |
| 7,728,323 B2 | 6/2010 | Oshima |
| 8,829,651 B2 | 9/2014 | Oshima |
| 8,858,708 B1 | 10/2014 | Callahan et al. |
| 9,246,049 B2 | 1/2016 | Oshima |
| 2003/0017685 A1 | 1/2003 | Usui et al. |
| 2003/0211710 A1 | 11/2003 | Hiramatsu et al. |
| 2007/0128753 A1 | 6/2007 | Oshima |
| 2007/0246733 A1* | 10/2007 | Oshima ................... C30B 25/02 257/103 |
| 2007/0269991 A1 | 11/2007 | Jang et al. |
| 2008/0303032 A1* | 12/2008 | Dwilinski ................ C30B 9/00 257/76 |
| 2008/0315245 A1 | 12/2008 | Oshima |
| 2011/0073039 A1 | 3/2011 | Colvin |
| 2012/0000415 A1* | 1/2012 | D'Evelyn ............... C30B 25/02 117/94 |

FOREIGN PATENT DOCUMENTS

| | | |
|---|---|---|
| CN | 100428409 C | 10/2008 |
| JP | H11-135882 A | 5/1999 |
| JP | 2002-305155 A | 10/2002 |
| JP | 2002-316892 A | 10/2002 |
| JP | 2004-006568 A | 1/2004 |
| JP | 2004-296639 A | 10/2004 |
| JP | 2005-303168 A | 10/2005 |
| JP | 3886341 B2 | 2/2007 |
| JP | 2007-153664 A | 6/2007 |
| JP | 2007-294518 A | 11/2007 |
| JP | 2009-227480 A | 10/2009 |

OTHER PUBLICATIONS

Japanese Office Action dated Jul. 21, 2015 with English translation.
Japanese Office Action dated Aug. 9, 2016 with an English translation thereof.
U.S. Office Action dated Apr. 7, 2015 in U.S. Appl. No. 13/569,983.
Chinese Office Action dated Jul. 31, 2018 in Chinese Patent Application No. 2016109824843 with an English translation.
Chinese Office Action dated Mar. 15, 2019, in corresponding Chinese Patent Application No. 201610982484.3, with an English translation thereof.

* cited by examiner

METAL CHLORIDE GAS GENERATOR, HYDRIDE VAPOR PHASE EPITAXY GROWTH APPARATUS, AND NITRIDE SEMICONDUCTOR TEMPLATE

The present application is a Divisional application of U.S. patent application Ser. No. 13/569,983, filed on Aug. 8, 2012 now U.S. Pat. No. 9,236,252, which is based on and claims priority from Japanese patent application No. 2011-178413 filed on Aug. 17, 2011, the entire contents of which are incorporated herein by reference.

BACKGROUND OF THE INVENTION

1. Field of the Invention

This invention relates to a metal chloride gas generator, a hydride vapor phase epitaxy growth apparatus, and a nitride semiconductor template.

2. Description of the Related Art

Gallium nitride compound semiconductors, such as gallium nitride (GaN), aluminum gallium nitride (AlGaN), and indium gallium nitride (InGaN) have attracted attention as light-emitting device materials capable of red through ultraviolet light emission. One growing method for these gallium nitride compound semiconductor crystals is a Hydride Vapor Phase Epitaxy (HVPE) growing method using metal chloride gas and ammonia as raw material.

A feature of the HVPE method is as follows. According to this method, it is possible to obtain a growth rate of 10 μm/hr to 100 μm/hr or higher which is remarkably higher than a typical growth rate of several μm/hr in other growing methods such as Metal Organic Vapor Phase Epitaxy (MOVPE) and Molecular Beam Epitaxy (MBE). For this reason, the HVPE method has been often used in the manufacture of a GaN free-standing substrate (see e.g. JP Patent No. 3886341) and an AlN free-standing substrate. Here, the term "free-standing substrate" refers to a substrate having such strength to hold its own shape and not to cause inconvenience in handling.

In addition, a light-emitting diode (LED) made of a nitride semiconductor is typically formed over a sapphire substrate. In its crystal growth, after a buffer layer is formed over a surface of the substrate, a GaN layer having a thickness of the order of 10 to 15 μm including an n-type layer is grown thereover, and an InGaN/GaN multiple quantum well light-emitting layer (several hundreds nm thick in total) and a p-type layer (200 to 500 nm thick) are grown thereover in this order. The GaN layer under the light-emitting layer is thick in order to improve the crystallinity of GaN on the sapphire substrate and the like. This is followed by electrode formation, resulting in a final device structure as shown in FIG. 7 which will be described later. In the case of growth with the MOVPE method, the crystal growth typically requires about 6 hours, and about half of 6 hours is the time required to grow a so-called "template portion" that are nitride semiconductor layer(s) e.g. GaN layer(s) under the light-emitting layer.

From the above, it is supposed, if it is possible to apply the HVPE method with the remarkably high growth rate to the growth of the template, it will be possible to substantially shorten the growth time, thereby dramatically reduce LED wafer manufacturing cost. In growing the template portion with the HVPE method which can lower the production cost, however, due to contamination by many unintended impurities, it is difficult to fabricate the good quality template.

For the HVPE apparatus used for manufacturing the nitride semiconductor, Ga, $NH_3$ gas, HCl gas are generally used as main raw material. In addition, the growth temperature required for effectively forming a film is a high temperature, namely, not lower than 1000 degrees Celsius. For this reason, a material to be used for a gas inlet pipe and a reactor is e.g. quartz that is chemical resistant and heat resistant to $NH_3$ gas and HCl gas that are highly reactive at high temperature. Specifically, the HVPE apparatus has a structure as shown in FIG. 8 which will be described later, and has a tube reactor made of quartz divided into a raw material section on its upstream side (i.e. upstream raw material section) and a growing section on its downstream side (i.e. downstream growing section), and an upstream open end of the reactor is closed by an upstream flange made of stainless steel (SUS), and the gas inlet pipes made of quartz are installed through the upstream flange from the raw material section towards the growing section. Because the gas inlet pipes made of quartz cannot be attached directly to the upstream flange, a pipe made of SUS is connected to an outer side of an upstream end of each of the gas inlet pipes, and this pipe is attached to the upstream flange (see e.g. JP-A-2002-305155).

SUMMARY OF THE INVENTION

In the above-configured HVPE apparatus, however, radiant heat from the growing section the temperature of which is the highest in the apparatus is conducted to the pipe, so that the temperature of the pipe portion is also high. When the temperature of the pipe is high, the gas flowing through the pipe tends to react with the constituent material of the pipe, and the constituent material of the pipe may be scraped off (corroded) by this gas, and the nitride semiconductor template may be contaminated with this corroded constituent material of the pipe portion as unintended impurities. Particularly, the impurity contaminations are significantly due to interfusion of impurities from the pipe portion through which the corrosive $NH_3$ or HCl gas flows.

Through the specification and claims, the "nitride semiconductor template" or simply "template" means a device which includes a substrate and nitride semiconductor layer(s) e.g. GaN layers to be provided under a light-emitting layer, and may further include a buffer layer or the like. Further, the "template portion" means the nitride semiconductor layer(s) in the "nitride semiconductor template".

Accordingly, it is an object of the present invention to provide a metal chloride gas generator, a hydride vapor phase epitaxy growth apparatus, and a nitride semiconductor template that suppress interfusion of unintended impurities into the nitride semiconductor template.

As a result of earnest study to achieve the above described problem, the inventors have found that the nitride semiconductor template made by using the metal chloride gas generator to be used at not lower than 1000° C. is contaminated by unintended impurities because the constituent material of the pipe is corroded by the gas flowing in the high temperature SUS pipe at the gas inlet and interfuses into the template as the unintended impurities.

By reducing the radiant heat from the heater, it is possible to suppress the rise in temperature of the SUS pipe portion at the gas inlet to some extent. The Inventors however found that the above-mentioned method has a limit. The reason thereof can be described as follows. The Inventors found that the contamination by unintended impurities is caused by the effect of the high temperature of the SUS pipe portion at the gas inlet due to the gas inlet pipe acting as an optical waveguide, more specifically, because the quartz material of the above gas inlet pipe is a light transmissive material.

Here, the "optical waveguide phenomenon" refers to a radiant heat waveguiding phenomenon due to the gas inlet pipe acting as an optical waveguide.

For this reason, in order to suppress the temperature rise in the SUS pipe portion at the gas inlet, heat shield plate(s) are first provided between the growing section at the highest temperature and the gas inlet to suppress the temperature rise due to the radiant heat. In addition, the Inventors found that the contamination by impurities is suppressed by bending a portion of the gas inlet pipe between the heat shield plate(s) (more specifically, the heat shield plate which is closer to the gas inlet) and the upstream end (more specifically, the gas inlet) to change the position of the gas inlet to suppress the temperature rise in the SUS pipe portion at the gas inlet. The radiant heat caused at the downstream side of the gas inlet pipe (specifically, the radiant heat from the growing section of the metal chloride gas generator) is suppressed by the heat shield plate(s) and the bent structure of the gas inlet pipe, and the heat is less likely to be conducted to the upstream end to suppress the temperature rise in the upstream end. According to this structure, the gas introduced from the gas inlet pipe is suppressed from being contaminated by the constituent material of the pipe as impurities at the upstream end.

According to a feature of the invention, a metal chloride gas generator comprises:

a tube reactor including a receiving section for receiving a metal on an upstream side, and a growing section in which a growth substrate is placed on a downstream side;

a gas inlet pipe arranged to extend from an upstream end with a gas inlet via the receiving section to the growing section, for introducing a gas from the upstream end to supply the gas to the receiving section, and supplying a metal chloride gas produced by a reaction between the gas and the metal in the receiving section to the growing section; and a heat shield plate placed in the reactor to thermally shield the upstream end from the growing section, wherein the gas inlet pipe is bent between the upstream end and the heat shield plate.

According to another feature of the invention, a hydride vapor phase epitaxy growth apparatus comprises:

the above-defined metal chloride gas generator.

According to a still another feature of the invention, a nitride semiconductor template comprises:

a substrate; and a chlorine-containing nitride semiconductor layer, wherein the chlorine-containing nitride semiconductor layer contains an iron concentration of not higher than $1 \times 10^{17}$ cm$^{-3}$.

Effects of the Invention

According to the present invention, it is possible to suppress interfusion of unintended impurities into the nitride semiconductor template.

BRIEF DESCRIPTION OF THE DRAWINGS

The preferred embodiments according to the invention will be explained below referring to the appended drawings, wherein.

DETAILED DESCRIPTION OF THE PREFERRED EMBODIMENTS

Figure 1:
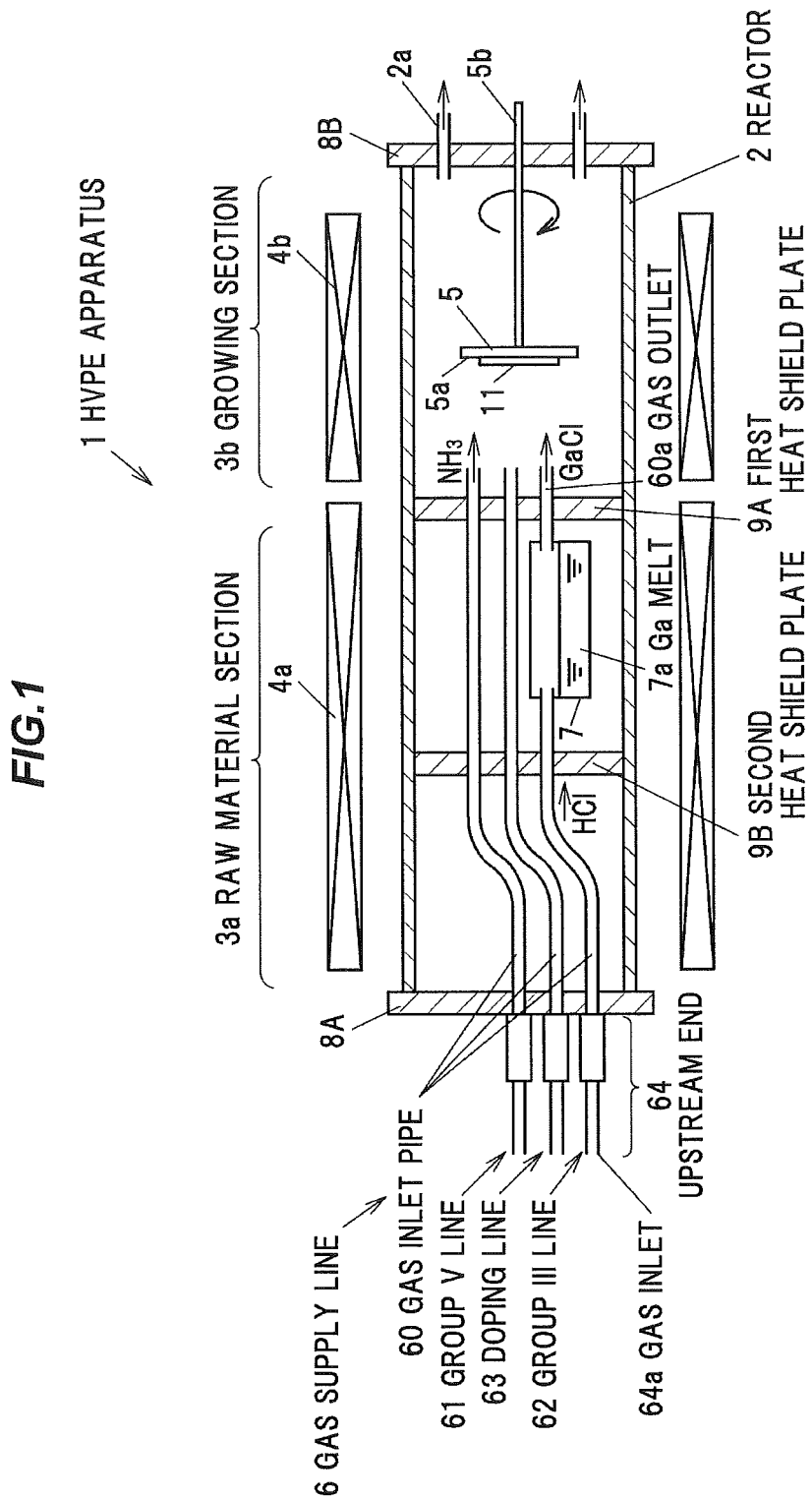
FIG. 1 is a diagram showing an example of schematic configuration of an HVPE apparatus in a first embodiment according to the present invention.

Next, preferred embodiments according to the invention will be described in more detail in conjunction with the appended drawings. It should be noted that in each figure, for components having substantially the same functions, duplicate description thereof will be omitted given the same reference numerals.

SUMMARY OF THE EMBODIMENT

A metal chloride gas generator in this embodiment comprises a tube reactor including a receiving section for receiving a metal on an upstream side, and a growing section in which a growth substrate is placed on a downstream side; a light transmissive gas inlet pipe arranged to extend from an upstream end with a gas inlet via the receiving section to the growing section, for introducing a gas from the upstream end to supply the gas to the receiving section, and supplying a metal chloride gas produced by a reaction between the gas and the metal in the receiving section to the growing section; and a heat shield plate placed in the reactor to thermally shield the upstream end from the growing section. Specifically, the heat shield plate thermatically shields between an upstream end side portion of the gas inlet pipe and a growing section side portion of the gas inlet pipe. The gas inlet pipe is configured to be bent between the upstream end and the heat shield plate.

The above gas inlet pipe may introduce a chloride gas from the gas inlet. In addition, the above heat shield plate may comprise carbon or quartz. The above upstream end may comprise a metal.

Radiant heat from the growing section is prevented by the heat shield plate to suppress a rise in temperature of the upstream end of the gas inlet pipe. The gas inlet pipe is configured to be bent between the heat shield plate and the upstream end, so that the radiant heat from the growing section is less likely to be conducted to the upstream end, and the temperature of the upstream end is even further suppressed from rising.

In addition, the hydride vapor phase epitaxy growth apparatus (hereinafter, referred to as "HVPE apparatus") in this embodiment is equipped with the above described metal chloride gas generator. The gas inlet pipe included in the metal chloride gas generator may comprise quartz.

In addition, the nitride semiconductor template in this embodiment has a substrate and a chlorine-containing nitride semiconductor layer, and the chlorine-containing nitride semiconductor layer contains an iron concentration of not higher than $1 \times 10^{17}$ cm$^{-3}$. The nitride semiconductor template comprises a plurality of nitride semiconductor layers formed over a heterogeneous substrate, and made of a homogeneous material different from that of the heterogeneous substrate.

In the above nitride semiconductor, a full width at half maximum (FWHM) of a (0004) plane of X-ray diffraction (XRD) is preferably not less than 200 seconds and not more than 300 seconds. The above nitride semiconductor template may have a Si-doped GaN layer containing a Si concentration of not less than $5 \times 10^{18}$ cm$^{-3}$ and not more than $5 \times 10^{19}$ cm$^{-3}$.

First Embodiment

FIG. 1 is a diagram showing an example of schematic configuration of an HVPE apparatus 1 in a first embodiment according to the present invention. This HVPE apparatus 1 is divided into a raw material section 3a on an upstream side and a growing section 3b on a downstream side, which are heated by separate raw material section heater 4a and growing section heater 4b to about 850 degrees Celsius and 1100 degrees Celsius, respectively.

In addition, an HVPE apparatus has a tube reactor 2, and an upstream open end of the reactor 2 is closed by an upstream flange 8A made of stainless steel (SUS), while a downstream open end of the reactor 2 is closed by a downstream flange 8B made of SUS. Four system gas supply lines 6 of a group V line 61, group III (for Al and Ga) line 62, and a doping line 63 are installed through the upstream flange 8A from the raw material section 3a towards the growing section 3b.

The group V line 61, the group III line 62 and the doping line 63 are constituted by the same gas inlet pipes 60. Each of the gas inlet pipes 60 is arranged to extend from an upstream end 64 having a gas inlet 64a towards the growing section 3b. It should be noted that the group III line 62 is arranged to extend via a tank 7 as a receiving section (as described later) towards the growing section 3b. The upstream end 64 is formed of a metal such as SUS. The gas inlet pipe 60 made of quartz is formed of e.g. a light-transmissive high purity quartz. Because the gas inlet pipe 60 made of quartz cannot be attached directly to the upstream flange 8A, the upstream end 64 having a pipe made of SUS connected to an outer side of an upstream end of each of the gas inlet pipes 60 is attached to the upstream flange 8A.

From the group V line 61, hydrogen, nitrogen, or a mixture of these gases is supplied as a carrier gas together with ammonia (NH$_3$) as a nitrogen raw material.

From the group III line 62, hydrogen, nitrogen, or a mixture of these gases is supplied as a carrier gas together with hydrogen chloride (HCl) to provide chloride gas. In the middle of the Group III line 62, the tank 7 as a receiving section that receives a gallium metal (Ga) melt 7a is installed. In the tank 7, GaCl gas as metal chloride gas is generated by the reaction of Ga metal and HCl gas and sent to the growing section 3b.

From the doping line 63, for the case that the doping is not carried out, e.g., when an undoped GaN layer (un-GaN layer) 13 is grown, a mixture gas of hydrogen and nitrogen is introduced, and when a Si-doped GaN layer 14 is grown, dichlorosilane (diluted with hydrogen, 100 ppm) as a raw material of Si, HCl gas, hydrogen, and nitrogen are introduced. Further, from the doping line 63, when the baking process is carried out to remove GaN-based deposits attached in the HVPE apparatus 1 after the HVPE growth, HCl gas, hydrogen, and nitrogen are introduced.

In the growing section 3b, a tray 5 which rotates at a rotational speed of about 3 to 100 r/min is installed, and a sapphire substrate 11 is installed on a plane (installation plane) 5a which faces to a gas outlet 60a of each of the gas supply lines 6. The raw material gas flown from the sapphire substrate 11 towards the downstream side is evacuated through an exhaust pipe 2a from a most downstream part. The growth in the this embodiment and examples was carried out at normal pressure of $1.013 \times 10^5$ Pa (1 atm).

The tank 7 and a rotation shaft 5b of the tray 5 are made of high-purity quartz, and the tray 5 is made of SiC coated carbon.

Further, in the HVPE apparatus 1, a first heat shield plate 9A is disposed between the growing section 3b a temperature of which is the highest in the reactor 2 and the raw material section 3a, and a second heat shield plate 9B is disposed between the upstream flange 8A and the first heat shield plate 9A, in order to suppress the temperature rise near the entrance to the reactor 2 of the gas supply line 6, namely, to thermally shield the upstream end 64 from the growing section 3b. By placing the first and second heat shield plates 9A, 9B between the growing section 3b and the gas inlet 64a of the gas supply line 6, it is possible to shield the radiant heat from the growing section 3b by the first and second heat shield plates 9A, 9B, thereby suppress the temperature rise of a region in the vicinity of the gas inlet 64a (the upstream end 64) of the gas supply line 6.

Further, the gas supply line 6 is bent (flexed) in the middle thereof such that a position thereof that passes through the first and second heat shield plates 9A, 9B is substantially located in the vicinity of a center in a radial direction of the reactor 2, while a position thereof that passes through the upstream flange 8A is eccentrically located from the center in the radial direction of the reactor 2.

In other words, the structure of the gas supply line 6 is not a straight pipe structure but a bent structure, and the first and the second heat shield plates 9A, 9B are arranged between the growing section 3b in a high temperature growing region and the gas inlet 64a. The gas supply line 6 has a straight portion between the growing section 3b and the second heat shield plate 9B, and a bent portion between the second heat shield plate 9B and the upstream flange 8A.

The first and second heat shield plates 9A, 9B may be made of e.g. quartz or carbon. The second heat shield plate 9B on the side of (i.e. closer to) the gas inlet 64a is preferably made of quartz, while the first heat shield plate 9A on the side of (i.e. closer to) the growing section 3b is preferably made of carbon. In addition, although the heat shielding effect is enhanced in accordance with the increase in number of the heat shield plates 9A, 9B, the heat shielding effect may be deteriorated if the number of the heat shield plates 9A, 9B is too large. Therefore, it is preferable that the number of the heat shielding plates 9 is approximately 2 to 5.

The effect is enhanced in accordance with the increase in eccentricity (i.e. a distance between a center of the straight portion and a center of the bent portion) of the gas inlet pipe 60. In this embodiment, the gas inlet pipe 60 is eccentrically configured (bent) for about 10 to 20 mm. It is preferable that the gas inlet pipe 60 is eccentrically configured such that the eccentricity thereof is not less than a length of a diameter of the gas inlet pipe 60. When the gas inlet pipe 60 has a diameter of 10 mm, the eccentricity thereof is preferably at least 10 mm. When the gas inlet pipe 60 has a diameter of 20 mm, the eccentricity thereof is preferably at least 20 mm.

Effects of the First Embodiment

According to the present embodiment, since it is possible to suppress the temperature rise in vicinity of the gas inlet 64a (the upstream end 64) of the gas inlet pipe 60, it is possible to suppress the interfusion of impurities into the gas inlet pipe 60 from the upstream end 64 made of SUS.

Second Embodiment

Figure 2:
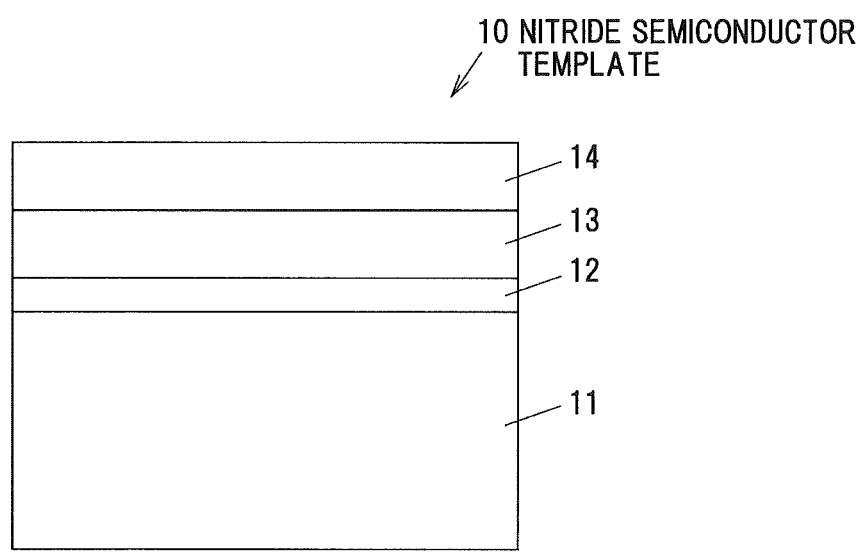
FIG. 2 is a cross-sectional view showing a nitride semiconductor template in a second embodiment according to the present invention.

FIG. 2 is a cross-sectional view of a nitride semiconductor template 10 according to a second embodiment of the present invention.

A nitride semiconductor template 10 is produced with using the HVPE apparatus 1 as shown in FIG. 1. The nitride semiconductor template 10 has a sapphire substrate 11, an AlN buffer layer 12 formed on the sapphire substrate 11, an undoped GaN layer 13 formed as a first layer on the AlN buffer layer 12, and a Si-doped GaN layer 14 formed as a second layer on the undoped GaN layer 13. The undoped GaN layer 13 and Si-doped GaN layer 14 are an example of the template portion in the nitride semiconductor template.

If the template portion of the nitride semiconductor template 10 consists of undoped GaN layer, the crystallinity will be improved. The nitride semiconductor template 10, however, has a portion through which current flows, so that it is naturally necessary to dope the GaN layer with n-type impurities such as Si. Here, Si concentration of the Si-doped GaN layer 14 of the nitride semiconductor template 10 is preferably $5 \times 10^{18}$ $cm^{-3}$ to $5 \times 10^{19}$ $cm^{-3}$ for this purpose. In this embodiment, the Si concentration is $1 \times 10^{19}$ $cm^{-3}$. Namely, this embodiment is not configured to improve the crystallinity by lowering the Si concentration, but configured to suppress the contamination by unintended impurities even with the Si concentration in the order of $10^{19}$ $cm^{-3}$, thereby narrow the full width at half maximum (FWHM) of a (0004) plane of X-ray diffraction (XRD), to provide the nitride semiconductor template with excellent crystallinity.

Effect of the Second Embodiment

According to the present embodiment of the invention, it is possible to provide a nitride semiconductor template which can be suitably used in the high efficiency semiconductor light-emitting device, by the development of metal chloride gas generator as described above which can suppress the contamination by unintended impurities. In addition, it is possible to significantly shorten the growth time by forming a nitride semiconductor with using the HVPE method. As a result, it is possible to provide a template for a high performance light-emitting device at a low cost. Namely, this nitride semiconductor template is a template which is useful for fabricating the high-brightness semiconductor light-emitting device.

Next, the present invention will be described in more detail by the following examples. However, the present invention is not limited thereto.

Example 1

First, Example 1 of the present invention will be explained below.

In Example 1, a nitride semiconductor template 10 as shown in FIG. 2 was produced with the use of the HVPE apparatus 1 as shown in FIG. 1. In Example 1, the second heat shield plate 9B made of quartz was provided on the side of the gas inlet 64a as a first piece, and the first heat shield plate 9A made of carbon was provided on the side of the growing section 3b as a second piece.

As the sapphire substrate 11, a substrate having a thickness of 900 μm and a diameter of 100 mm (4 inches) was used. First, the AlN buffer layer 12 having a film thickness of about 20 nm was formed on the sapphire substrate 11, the undoped GaN layer 13 was grown to have a thickness of about 6 μm on the AlN buffer layer 12, and the Si-doped GaN layer 14 was grown to have a thickness of about 2 μm on the undoped GaN layer 13.

The HVPE growth was carried out as follows. After the sapphire substrate 11 was set on the tray 5 of the HVPE apparatus 1, pure nitrogen was flown thereinto to expel the air in the reactor 2. Next, the sapphire substrate 11 was held for 10 minutes at a substrate temperature of 1100 degrees Celsius in a mixture gas of hydrogen at a flow rate of 3 slm and a nitrogen at a flow rate of 7 slm. Thereafter, hydrogen and nitrogen as the carrier gas and trimethyl aluminum (TMA) were frown from the group III line 62, and $NH_3$ and hydrogen were flown from the group V line 61 to grow the AlN buffer layer 12. The undoped GaN layer 13 is further grown at a growth rate of 60 μm/hr. As to the flow rate of each gas for this process, HCl, hydrogen and nitrogen were flown from the group III line 62 at 50 sccm, 2 slm, and 1 slm, respectively, and $NH_3$ and hydrogen were flown from the group V line 61 at 2 slm and 1 slm, respectively. The growth time was 6 minutes.

After the undoped GaN layer 13 was grown as the first layer, the Si-doped GaN layer 14 was grown as the second layer by introducing dichlorosilane as Si material from the Si doping line 63 for 2 minutes under the same basic growth conditions as those of the first layer. Thereafter, $NH_3$ and nitrogen were flown at 2 slm and 8 slm, respectively, and the substrate temperature was cooled down until around a room temperature. Thereafter, the nitrogen purging was carried out for several dozens of minutes such that a nitrogen atmosphere was provided in the reactor 2, then the nitride semiconductor template 10 was taken out.

The full width at half maximum (FWHM) of the (0004) plane of the X-ray diffraction (XRD) of the nitride semiconductor template 10 in Example 1 produced as described above was 237.8 seconds. To analyze the impurities, SIMS analysis was also performed. The elements to be analyzed by SIMS analysis were three kinds of elements, i.e. Fe, Cr and Ni that are considered as impurities resulted from SUS.

Figure 3:
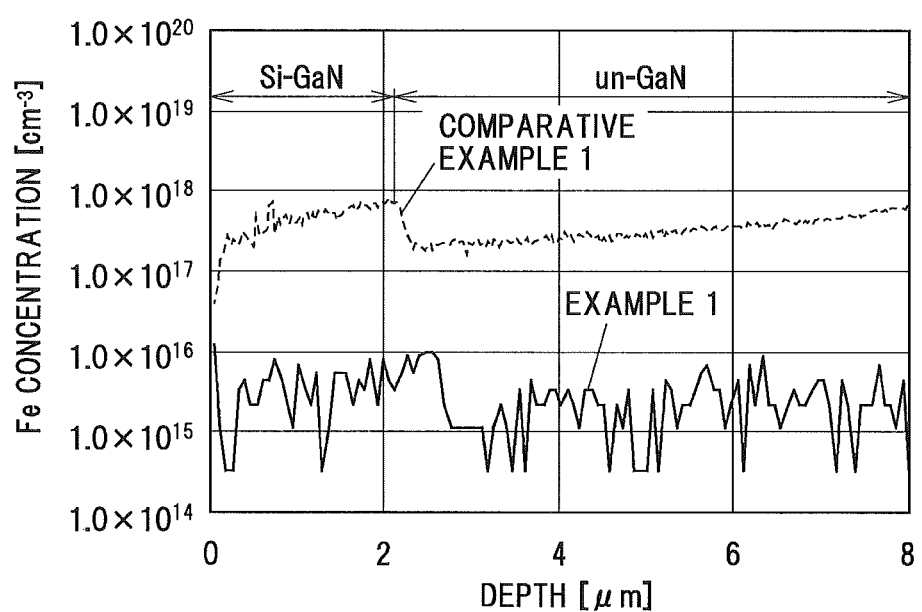
FIG. 3 is a graph showing a result of SIMS analysis of Fe.

FIG. 3 shows the results of SIMS analysis of Fe. For comparison with the conventional arts, FIG. 3 also shows the result of Comparative Example 1. It was confirmed that the Fe concentration of the undoped GaN layer (un-GaN) 13 and the Si-doped GaN layer (Si—GaN) 14 in Example 1 was about $2 \times 10^{15}$ $cm^{-3}$ that is reduced by about two digit order than the Fe concentration of $2.5 \times 10^{17}$ $cm^{-3}$ to $8.0 \times 10^{17}$ $cm^{-3}$ in Comparative Example 1 to be described later.

Figure 4:
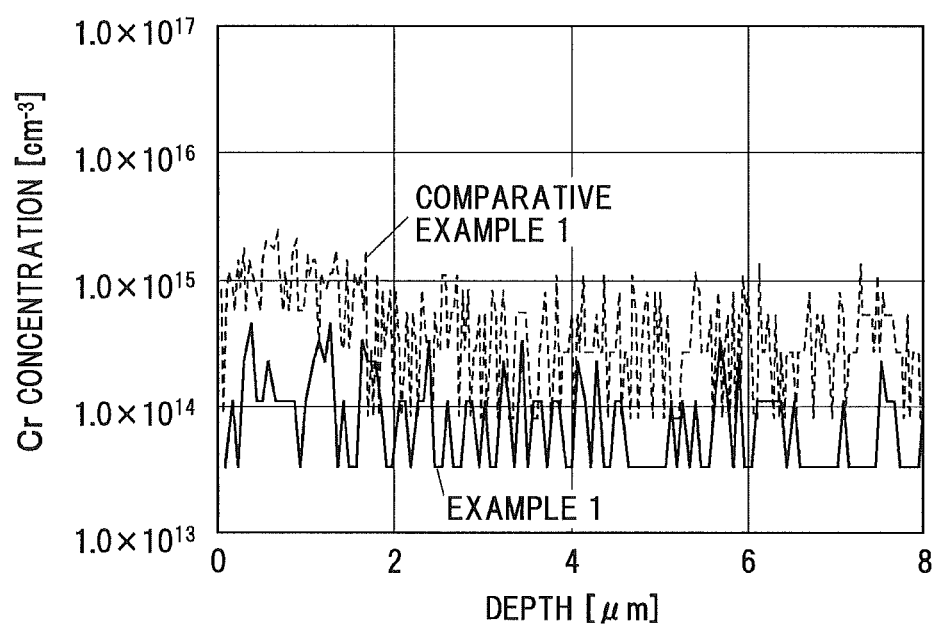
FIG. 4 is a graph showing a result of SIMS analysis of Cr.

FIG. 4 shows the results of SIMS analysis of Cr. For comparison with the conventional arts, FIG. 4 also shows the results of Comparative Example 1. It was confirmed that the Cr concentration of the undoped GaN layer (un-GaN) 13 and the Si-doped GaN layer (Si—GaN) 14 in Example 1 was $1 \times 10^{14}$ $cm^{-3}$ (the lower detection limit is $2 \times 10^{14}$ $cm^{-3}$) that is reduced by about one digit order than the Cr concentration of about $0.2 \times 10^{15}$ $cm^{-3}$ to $2 \times 10^{15}$ $cm^{-3}$ in Comparatice Example 1.

Figure 5:
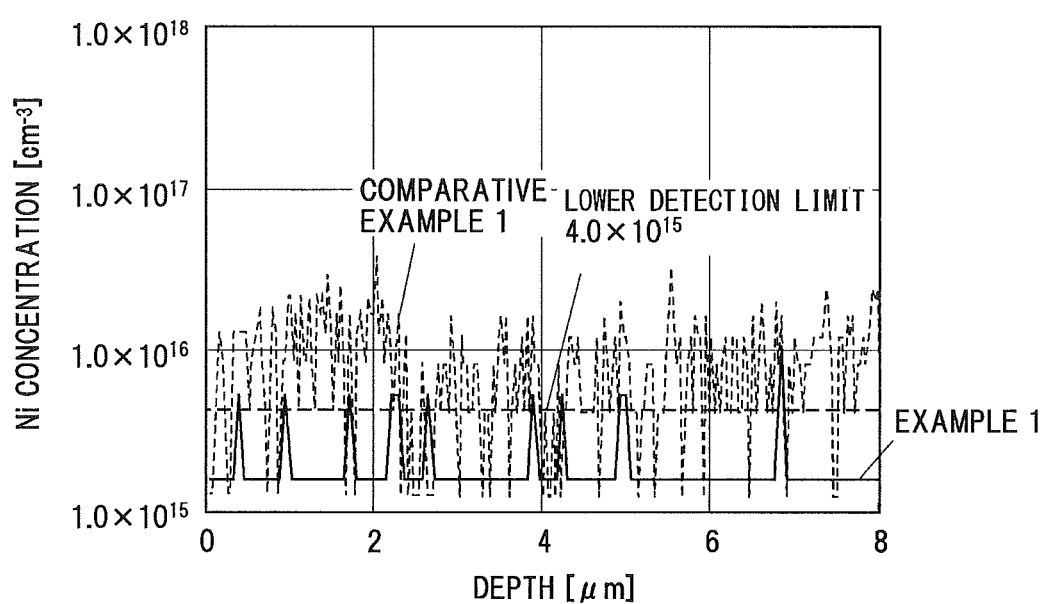
FIG. 5 is a graph showing a result of SIMS analysis of Ni.

FIG. 5 shows the results of SIMS analysis of Ni. For comparison with the conventional arts, FIG. 5 also shows the results of Comparative Example 1. It was confirmed that the Ni concentration of the undoped GaN layer (un-GaN) 13 and the Si-doped GaN layer (Si—GaN) 14 in Example 1 was the lower detection limit of SIMS analysis (i.e. $4\times10^{15}$ cm$^{-3}$), although the Cr concentration in Comparatice Example 1 was detectable by SIMS analysis.

Example 2

Example 2 of the present invention of the present invention will be described below.

In Example 2, a nitride semiconductor template 10 as shown in FIG. 2 was produced with the use of the HVPE apparatus 1 as shown in FIG. 1. In Example 2, the nitride semiconductor template 10 was produced under the similar growth conditions as those in Example 1, except that HCl, hydrogen and nitrogen were flown from the group III gas line 62 at 50 sccm, 2.5 slm, and 0.5 slm when growing the undoped GaN layer 13 and the Si-doped GaN layer 14. The full width at half maximum (FWHM) of the (0004) plane of the X-ray diffraction (XRD) of the nitride semiconductor template 10 was 203.8 seconds. As to the impurity concentration of the undoped GaN layer 13 and the Si-doped GaN layer 14, the Fe concentration was about $7.0\times10^{14}$ cm$^{-3}$ to $9.0\times10^{15}$ cm$^{-3}$, and the Cr concentration was about $6.0\times10^{13}$ cm$^{-3}$ to $8.0\times10^{14}$ cm$^{-3}$. The Ni concentration was kept to a lower concentration than Comparative Example 1, similarly to Example 1. Thus, it is understood that the full width at half maximum (FWHM) of the (0004) plane became narrower.

It is confirmed that the full width at half maximum (FWHM) of the (0004) plane of the X-ray diffraction (XRD) was narrowed and that the crystallinity was improved. Further, it is confirmed that the above effects are provided by suppressing the contamination by unintended impurities. In addition, it is confirmed that Cl is contained in the undoped GaN layer 13 and the Si-doped GaN layer 14 grown by the HVPE apparatus 1.

From this result, it is confirmed that the quality of the nitride semiconductor template 10 was improved by reducing the impurities. To confirm the effect of this result, semiconductor light-emitting devices were produced by performing an epitaxial growth using the MOVPE method on the nitride semiconductor template 10 produced in Examples 1 and 2 (see FIG. 7), respectively, and the effects thereof were confirmed.

(Method of Manufacturing a Semiconductor Light-Emitting Device)

Next, a method for manufacturing the semiconductor light-emitting device will be described below in conjunction with the drawings.

Figure 6:
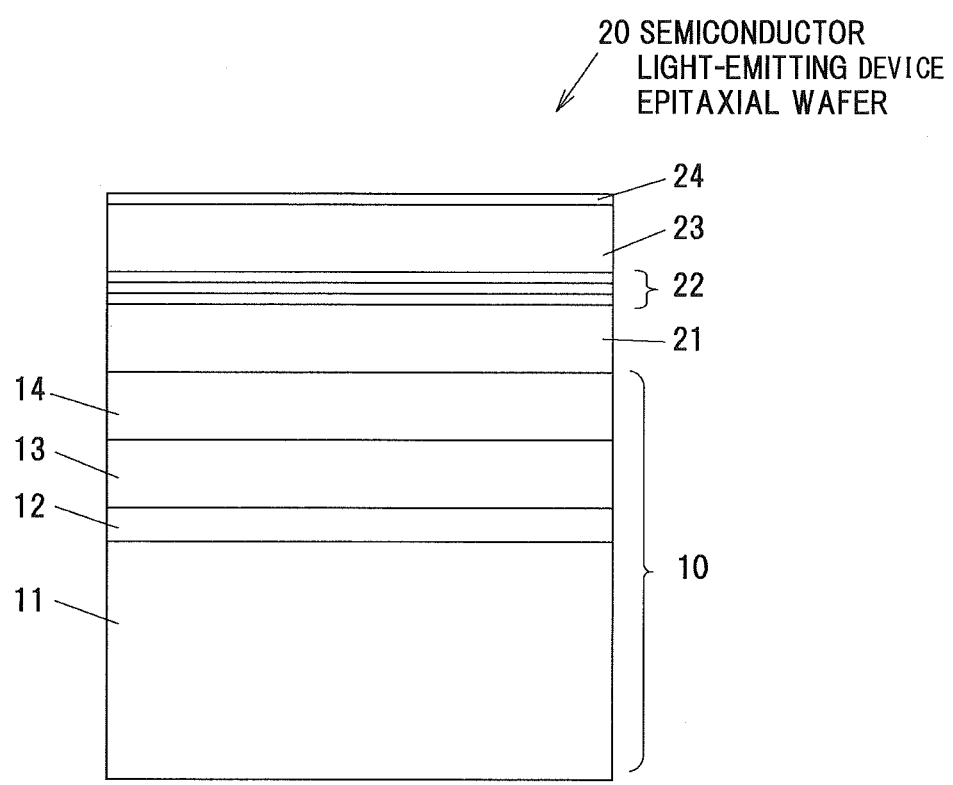
FIG. 6 is a cross-sectional view showing a semiconductor light-emitting device epitaxial wafer in this embodiment.
Figure 7:
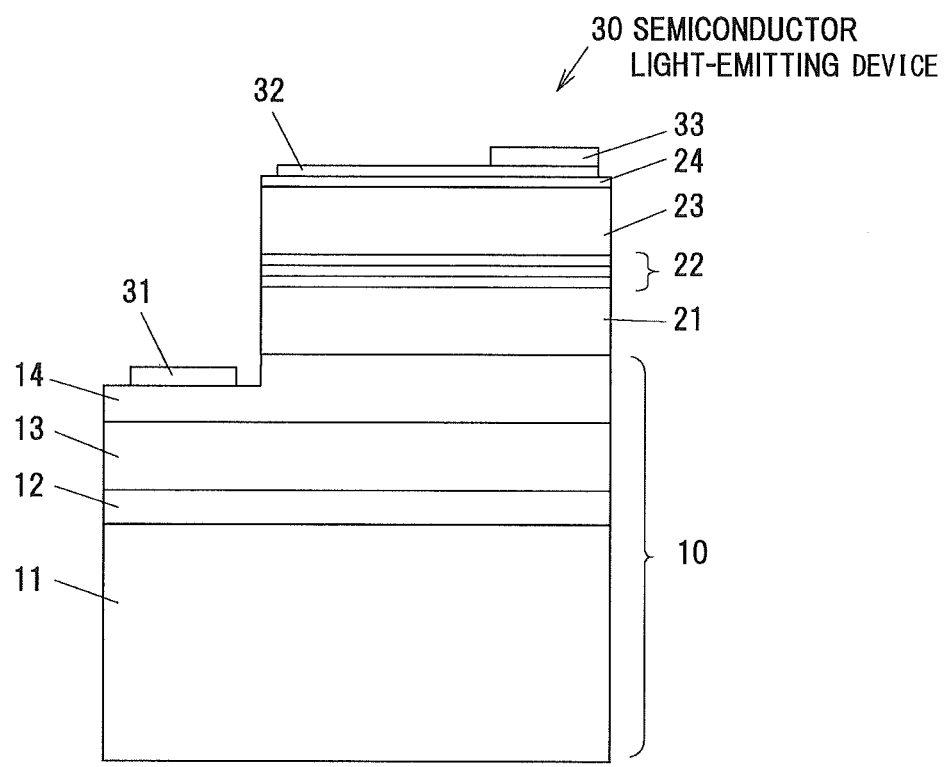
FIG. 7 is a cross-sectional view showing a semiconductor light-emitting device in an example according to the present invention.

FIG. 6 shows a cross-sectional view of a semiconductor light-emitting device epitaxial wafer 20 in this embodiment, and FIG. 7 is a cross-sectional view of a semiconductor light-emitting device 30 in this embodiment.

More specifically, an n-type GaN layer 21 was grown on the nitride semiconductor template 10 as shown in FIG. 2, six pairs of InGaN/GaN multiple quantum well layers 22 were grown on the n-type GaN layer 21, a p-type AlGaN layer 23 and a p-type GaN contact layer 24 were grown on the InGaN/GaN multiple quantum well layers 22, and after the growth of the laminated structure described above, the temperature of the reactor 2 was lowered to near the room temperature, then a semiconductor light-emitting device epitaxial wafer 20 as shown in FIG. 6 was taken out from the MOVPE apparatus.

Thereafter, a surface of the semiconductor light-emitting device epitaxial wafer 20 thus obtained was partially removed by RIE (Reactive Ion Etching) to expose a part of the n-type Si-doped GaN layer 14 of the nitride semiconductor template 10, and a Ti/Al electrode 31 was formed thereon. Further, a Ni/Au semi-transparent electrode 32 and an electrode pad 33 were formed on the p-type GaN contact layer 24, to provide a semiconductor light-emitting device 30 as shown in FIG. 7.

The emission characteristic of the semiconductor light-emitting device 30 was evaluated at a flowing current of 20 mA. The emission peak wavelength was about 450 nm, a forward voltage was 3.25 V, and the emission output was 15 mW. In addition, the reliability test of the semiconductor light-emitting device 30 was carried out by electric current applying test for 1000 hr at a flowing current of 50 mA and at a room temperature. As a result, the relative output was 98%, so that a sufficiently good reliability characteristic was confirmed. Here, "relative output"="(emission output after current flow for 168 hours/initial emission output)×100".

Comparative Example 1

Figure 8:
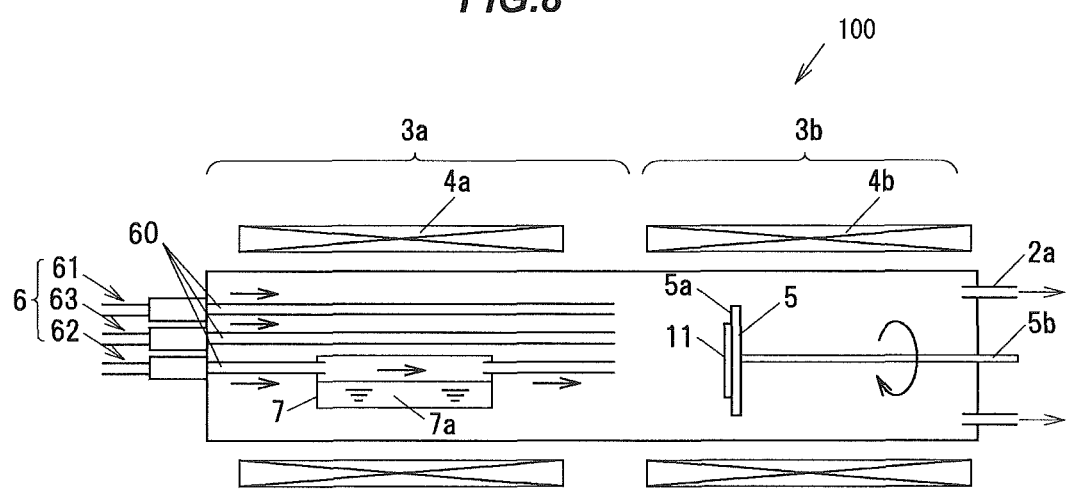
FIG. 8 is a diagram typically showing an HVPE apparatus in comparative example 1.

FIG. 8 shows an HVPE apparatus 100 according to Comparative Example 1. As Comparative Example 1, an HVPE apparatus 100 as shown in FIG. 8 was used.

The HVPE apparatus 100 in Comparative Example 1 is configured similar to the HVPE apparatus 1 shown in FIG. 1, except that the gas supply line 6 has a straight pipe structure, and the heat shield plates 9A, 9B are not provided.

Structure of the nitride semiconductor template 10 fabricated in Comparative Example 1 is the same as that in Example 1 as shown in FIG. 1, and the growth conditions are also same as those in Example 1. Further, structure, manufacturing conditions and growth conditions of a semiconductor light-emitting device epitaxial wafer 20 (see FIG. 6) and a semiconductor light-emitting device 30 (see FIG. 7) fabricated in Comparative Example 1 are the same as those in Example 1. All features are the same as those in Example 1 except the structure of the HVPE apparatus.

The full width at half maximum (FWHM) of the (0004) plane of the X-ray diffraction (XRD) of the nitride semiconductor template 10 produced as described above was 450.1 seconds. It is understood that the full width at half maximum (FWHM) in Example 1 was approximately halved in comparison with Comparative Example 1. The explanation with respect to the impurity concentration (see FIGS. 3 to 5) is omitted because it is already described in relation to Example 1.

The emission characteristic of the semiconductor light-emitting device 30 was evaluated at a flowing current of 20 mA. The emission peak wavelength was about 452 nm, a forward voltage was 3.21 V, and the emission output was 10 mW. Namely, due to the contamination by impurities such as Fe, Cr, and Ni, the crystal defects were increased. As a result, the full width at half maximum was broadened, so that an internal quantum efficiency was deteriorated, thereby the emission output was lowered. In other words, the contamination by impurities was suppressed in Example 1, so that the internal quantum efficiency was enhanced, thereby the emission output was increased.

Further, the reliability test of the semiconductor light-emitting device 30 in Comparative Example 1 was also carried out by electric current applying test for 1000 hr at a flowing current of 50 mA and at a room temperature. As a result, the relative output was 83%, so that it was confirmed that the reliability characteristic was not so good. It is obvious that the reliability was not good due to the poor crystallinity. Here, "relative output"="(emission output after current flow for 168 hours/initial emission output)×100".

Comparative Example 2

As Comparative Example 2, the HVPE apparatus 100 as shown in FIG. 8 was used. Structure of the nitride semiconductor template 10 fabricated in Comparative Example 2 is the same as that in Example 1 as shown in FIG. 1, and the growth conditions are also same as those in Example 1. Further, structure, manufacturing conditions and growth conditions of a semiconductor light-emitting device epitaxial wafer 20 (see FIG. 6) and a semiconductor light-emitting device 30 (see FIG. 7) fabricated in Comparative Example 2 are the same as those in Example 1.

However, the growth temperature was set to 900 degrees Celsius for suppressing the contamination by unintended impurities. Namely, all features are the same as those in Example 1 except that the temperature of the growing section 3b is 900 degrees Celsius.

The full width at half maximum (FWHM) of the (0004) plane of the X-ray diffraction (XRD) of the nitride semiconductor template 10 produced as described above was 432.5 seconds. The impurity concentrations are not shown but slightly more than those in Example 1. Namely, the contamination by unintended impurities was lowered by lowering the growth temperature, but the full width at half maximum (FWHM) of the (0004) plane was broadened.

The emission characteristic of the semiconductor light-emitting device 30 was evaluated at a flowing current of 20 mA. The emission peak wavelength was about 451 nm, a forward voltage was 3.22 V, and the emission output was 10 mW. Namely, when the contamination by impurities such as Fe, Cr, and Ni is suppressed by lowering the growth temperature, the crystal defects were increased. As a result, the full width at half maximum is broadened, so that an internal quantum efficiency was deteriorated, thereby the emission output was lowered.

Further, the reliability test of the semiconductor light-emitting device 30 in Comparative Example 2 was also carried out by electric current applying test for 1000 hr at a flowing current of 50 mA and at a room temperature. As a result, the relative output was 84%, so that it was confirmed that the reliability characteristic was not so good. It is obvious that the reliability was not good due to the poor crystallinity. Here, "relative output"="(emission output after current flow for 168 hours/initial emission output)×100".

(Variation 1)

In the embodiment of the present invention, a flat sapphire substrate was used. The same effect can also be obtained by using a so-called PSS (Patterned Sapphire Substrate) in which an uneven surface is formed on the sapphire substrate.

(Variation 2)

In the embodiment of the present invention, the growth rate was 60 μm/hr. The growth rate increased up to about 300 μm/hr is also applicable.

(Variation 3)

Since the present invention relates to a GaN film provided on the substrate, the intended effect of the present invention also can be obtained by using a buffer layer made of a material other than AlN.

(Variation 4)

Figure 9:
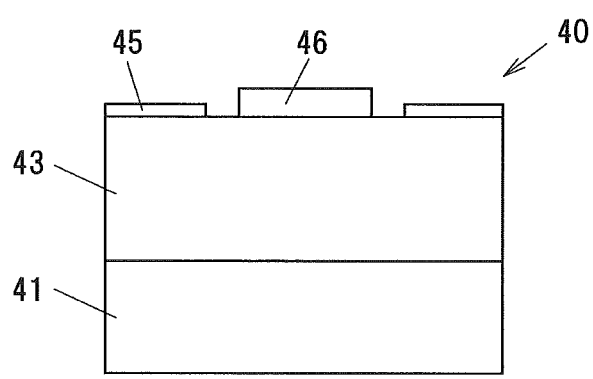
FIG. 9 is a cross-sectional view illustrating a Schottky barrier diode in variation 4 according to the present invention.

FIG. 9 is a cross-sectional view illustrating a Schottky barrier diode 40 according to a Variation 4 of the present invention. A Schottky barrier diode 40 has a sapphire substrate 41, and an n-type GaN layer 43 grown to have a thickness of 3.5 to 8 μm on the sapphire substrate 41, and an ohmic electrodes 45 and a Schottky electrode 46 formed on the n-type GaN layer 43.

The n-type GaN layer 43 is doped with e.g. Si, and the carrier concentration is $4 \times 10^{17}$ cm$^{-3}$.

The ohmic electrode 45 has a two-layer structure made of Ti/Al, in which a Ti layer having a thickness of e.g. 20 nm and an Al layer having a thickness of e.g. 200 nm are formed in this order on the n-type GaN layer 43.

The Schottky electrode 46 has a two-layer structure made of Ni/Au, in which a Ni layer having a thickness of e.g. 50 nm and a Au layer having a thickness of e.g. 500 nm are formed in this order on the n-type GaN layer 43.

In addition, the present invention is not limited to the above embodiments, examples, and variations, and it is possible to implement various modifications without going beyond the gist of the invention. For example, in the above embodiment and examples, the case of applying a metal chloride gas generator to the HVPE method is described, however, the present invention is not limited thereto, and may be applied to other growing methods.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A nitride semiconductor template, comprising:
a substrate;
a buffer layer disposed on the substrate; and
a chlorine-containing nitride semiconductor layer,
wherein the chlorine-containing nitride semiconductor layer contains an Fe concentration of not higher than $9.0 \times 10^{15}$ cm$^{-3}$, a Cr concentration of not higher than $8.0 \times 10^{14}$ cm$^{-3}$, and a Ni concentration of not higher than $4.0 \times 10^{15}$ cm$^{-3}$, and
wherein the buffer layer comprises AlN.

2. The nitride semiconductor template according to claim 1, wherein the substrate comprises a sapphire substrate.

3. The nitride semiconductor template according to claim 2, wherein a full width at half maximum of a (0004) plane of X-ray diffraction is not less than 200 seconds and not more than 300 seconds.

4. The nitride semiconductor template according to claim 2, wherein the chlorine-containing nitride semiconductor layer comprises a Si-doped GaN layer containing a Si concentration of not less than $5 \times 10^{18}$ cm$^{-3}$ and not more than $5 \times 10^{19}$ cm$^{-3}$.

5. A nitride semiconductor template, comprising:
a substrate;
a buffer layer disposed on the substrate; and
a chlorine-containing nitride semiconductor layer; and
an undoped GaN layer disposed on the buffer layer,
wherein the chlorine-containing nitride semiconductor layer contains an Fe concentration of not higher than $9.0 \times 10^{15}$ cm$^{-3}$, a Cr concentration of not higher than $8.0 \times 10^{14}$ cm$^{-3}$, and a Ni concentration of not higher than $4.0 \times 10^{15}$ cm$^{-3}$.

6. The nitride semiconductor template according to claim 5, wherein the chlorine-containing nitride semiconductor layer is disposed on the undoped GaN layer.

7. The nitride semiconductor template according to claim 6, wherein the chlorine-containing nitride semiconductor layer comprises a Si-doped GaN layer.

8. The nitride semiconductor template according to claim 2, wherein the chlorine-containing nitride semiconductor layer comprises a Si-doped GaN layer.

9. The nitride semiconductor template according to claim 2, wherein the Fe concentration of the chlorine-containing nitride semiconductor layer is in a range from $7.0 \times 10^{14}$ cm$^{-3}$ to $9.0 \times 10^{15}$ cm$^{-3}$.

10. A nitride semiconductor template, comprising:
a substrate;
a chlorine-containing nitride semiconductor layer; and
an undoped GaN layer disposed below the chlorine-containing nitride semiconductor layer,
wherein the chlorine-containing nitride semiconductor layer contains an Fe concentration of not higher than $9.0 \times 10^{15}$ cm$^{-3}$, a Cr concentration of not higher than $8.0 \times 10^{14}$ cm$^{-3}$, and a Ni concentration of not higher than $4.0 \times 10^{15}$ cm$^{-3}$, and
wherein an Fe concentration of the undoped GaN layer is in a range from $7.0 \times 10^{14}$ cm$^{-3}$ to $9.0 \times 10^{15}$ cm$^{-3}$.

11. The nitride semiconductor template according to claim 10, wherein the Cr concentration of the chlorine-containing nitride semiconductor layer is in a range from $6.0 \times 10^{13}$ cm$^{-3}$ to $8.0 \times 10^{14}$ cm$^{-3}$.

12. The nitride semiconductor template according to claim 11, wherein the Cr concentration of the undoped GaN layer is in a range from $6.0 \times 10^{13}$ cm$^{-3}$ to $8.0 \times 10^{14}$ cm$^{-3}$.

13. The nitride semiconductor template according to claim 2, wherein the Cr concentration of the chlorine-containing nitride semiconductor layer is in a range from $6.0 \times 10^{13}$ cm$^{-3}$ to $8.0 \times 10^{14}$ cm$^{-3}$.

14. The nitride semiconductor template according to claim 2, wherein the sapphire substrate comprises a Patterned Sapphire Substrate (PSS) in which an uneven surface is formed on the sapphire substrate.

15. The nitride semiconductor template according to claim 2, wherein the chlorine-containing nitride semiconductor layer comprises an n-type GaN layer.

16. The nitride semiconductor template according to claim 15, wherein the n-type GaN layer has a thickness of 3.5 μm to 8 μm on the sapphire substrate.

17. The nitride semiconductor template according to claim 15, wherein the n-type GaN layer is doped with Si.

18. The nitride semiconductor template according to claim 15, wherein a two-layer structure including is disposed on the n-type GaN layer.

19. The nitride semiconductor template according to claim 18, wherein a Schottky electrode including a two-layer structure of Ni/Au is further disposed on the n-type GaN layer.

20. The nitride semiconductor template according to claim 10, further comprising:
a buffer layer disposed on the substrate.

* * * * *